US007212940B2

(12) United States Patent
Ueno et al.

(10) Patent No.: US 7,212,940 B2
(45) Date of Patent: May 1, 2007

(54) TRANSMITTER AND TRANSMITTER TESTING METHOD

(75) Inventors: Madoka Ueno, Musashino (JP); Hiroki Yoshino, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 11/080,440

(22) Filed: Mar. 16, 2005

(65) Prior Publication Data

US 2006/0064284 A1 Mar. 23, 2006

(30) Foreign Application Priority Data

Sep. 8, 2004 (JP) ............................. 2004-260698

(51) Int. Cl.
*G01R 31/00* (2006.01)
*G06F 15/00* (2006.01)

(52) U.S. Cl. ....................................... 702/117; 702/185

(58) Field of Classification Search ................ 702/183, 702/186, 108, 117, 121, 122, 182, 185, 189; 714/25, 30, 48; 340/501, 506
See application file for complete search history.

(56) References Cited

U.S. PATENT DOCUMENTS 6,017,143 A * 1/2000 Eryurek et al. ............... 700/51
6,192,321 B1 * 2/2001 Grumstrup et al. ......... 702/113
6,745,107 B1 * 6/2004 Miller ........................ 700/282

FOREIGN PATENT DOCUMENTS

JP 3308119 5/2002
JP 2002-175112 6/2002

* cited by examiner

*Primary Examiner*—Bryan Bui
(74) *Attorney, Agent, or Firm*—Westerman, Hattori, Daniels & Adrian, LLP.

(57) ABSTRACT

A transmitter and a method for testing the transmitter which allow easy testing for a failure in the detection processing unit thereof, thereby reducing required manpower and cost, are provided. The transmitter is provided with a detection processing unit for detecting a process variable and processing an electric signal which is based on the process variable. The transmitter is characterized by containing a test unit for generating a malfunctioning state of the detection processing unit for the testing.

8 Claims, 7 Drawing Sheets

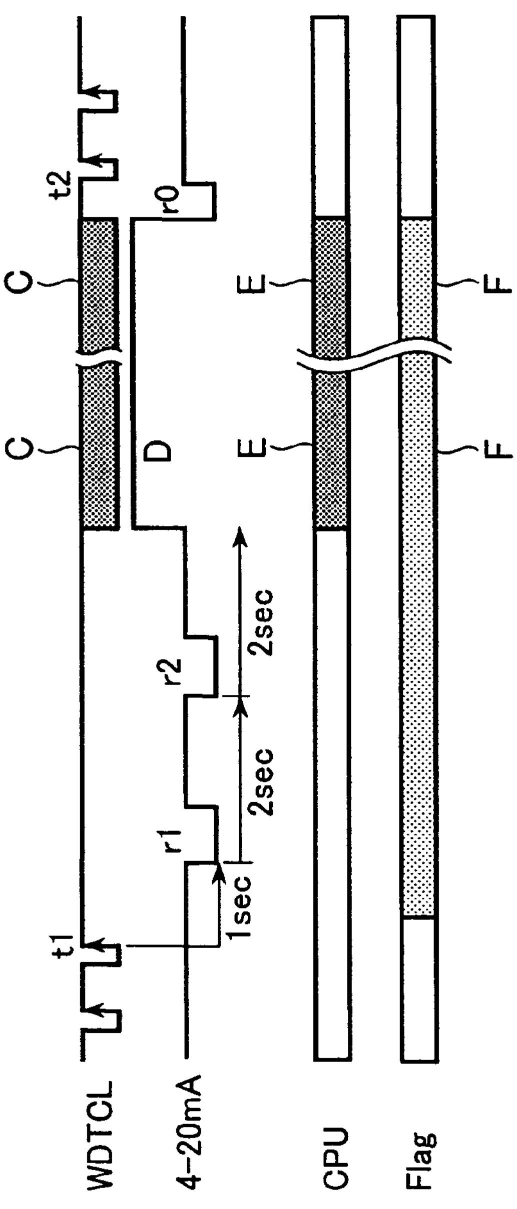
FIG. 7A
FIG. 7B
FIG. 7C
FIG. 7D
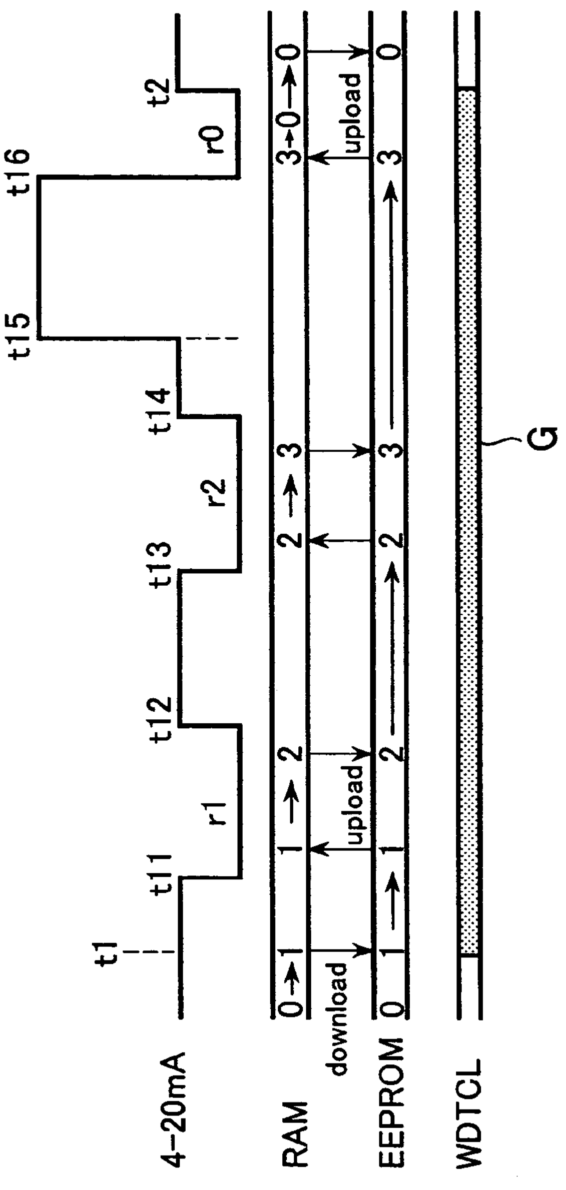
FIG. 8A
FIG. 8B
FIG. 8C
FIG. 8D

TRANSMITTER AND TRANSMITTER TESTING METHOD

BACKGROUND OF THE INVENTION

1. Field of the Invention

The present invention relates to a transmitter for processing an electric signal which is based on a process variable and outputting the result of the signal processing, as well as to a method for testing the transmitter. Particularly, the invention relates to a two wire process control transmitter which deals with pressure, temperature, flow rate, and the like, as well as to a method for testing the transmitter.

2. Description of the Prior Art

Basic functions of conventional transmitters are detecting a process variable and transmitting the detected process variable. In addition, some conventional transmitters are used for detecting a malfunction (see Patent Literature 1, for example), and others are used for temporarily changing a 4–20 mA standard range output into an abnormal value (see Patent Literature 2, for example).

One conventional transmitter will hereinafter be described with reference to FIG. 1. FIG. 1 is a block diagram showing the conventional transmitter.

The embodiment in FIG. 1 will here be explained. FIG. 1 is an embodiment of a two wire process control transmitter, where a transmitter 5 is connected to a power unit (distributor) 1 and to a load 3 via a transmission line 2. Normally, a current of 4–20 mA is output from the power unit 1 and flows through the transmission line 2, the transmitter 5, and the load 3, all connected in series.

The transmitter 5 is provided with an built-in display meter (LCD) 6. A communication terminal 7 is connected to the transmission line 2 and provided with a display unit 8 and a keyboard 9.

Further, the transmitter 5 detects a process variable such as static pressure, pressure differential, temperature, and flow rate by the use of sensors (not shown), further, the transmitter 5 converts the detected process variable into an electric signal, and processing the signal by the use of a microprocessor (not shown) to output 4–20 mA based on the electric signal to the transmission line 2.

The process variable becomes the 4–20 mA standard range output current and is applied to the load 3. In this way, the conventional example of FIG. 1 transmits the process variable information.

A detection processing means 200' included in the transmitter 5 will hereinafter be described with reference to FIG. 2. FIG. 2 is a block diagram showing the detection processing means 200' of the conventional transmitter.

The detection processing means 200' is comprised of hardware and includes a sensor 101 and a microprocessor 102'. The microprocessor 102' has a firmware processing unit 110'. The microprocessor 102' is connected to the sensor 101 and a memory (non-volatile storage unit) 103. The firmware processing unit 110' has an input processing unit 10, a diagnosis processing unit 11, and an output processing unit 12. Information generated by the firmware processing unit 110' is processed by the microprocessor 102'.

Operation of the conventional example of FIG. 2 will be described below.

Firstly, the steps of the input processing unit 10 are performed. As a result, in the case where the transmitter 5 is comprised of a resonant sensor, for example, pressure/ambient temperature of the process is input as a frequency f, and predetermined signal processing is performed to generate a calculated value A. Thus, the calculated value A is based on the frequency f, and thus is based on the pressure/ambient temperature of the process.

Secondly, steps of the diagnosis processing unit 11 are performed. As a result, if the frequency f is within a predetermined range, the diagnosis processing unit 11 diagnoses that there has not been any failure in the detection processing unit (sensor 101—no failure), whereas if the frequency f is outside the predetermined range, the diagnosis processing unit 11 diagnoses that there has been a failure in the detection processing unit (sensor 101—failure). More specifically, when the frequency f is 0, for example, the diagnosis processing unit 11 diagnoses that the sensor 101 of the detection processing unit is malfunctioning.

Alternatively, if the calculated value A obtained by the signal processing of the frequency f is in a predetermined range, the diagnosis processing unit 11 diagnoses that the process variable is normal. On the other hand, if the calculated value A obtained by the signal processing of the frequency f is outside the predetermined range, the diagnosis processing unit 11 diagnoses that the process variable is abnormal.

Then, the diagnosis information is stored in the memory 103 serving as a storage unit.

Thirdly, the steps of the output processing unit 12 are performed. The output processing unit 12 refers to the memory 103, and where operation is normal, that is, the detection processing unit is not malfunctioning and the process is normal, a current in the range 4–20 mA corresponding to the calculated value A is output. The built-in display meter 6 displays the 4–20 mA standard range output. The display unit 8 of the communication terminal 7 also displays the 4–20 mA standard range output. The conventional example of FIG. 2 transmits the process variable information in the above-described manner.

The memory 103 is checked and when there is a failure of the detection processing unit, the output current falls above or below the 4–20 mA range. As a result, the built-in display meter 6 displays an alarm. Further, the display unit 8 of the communication terminal 7 displays an alarm, too.

In the case where in checking the memory the process is malfunctioning though no failure is detected in the detection processing unit, the value of the 4–20 mA standard range output OUT is kept at the previous value.

[Patent Literature 1] Japanese Patent No. 3308119

[Patent Literature 2] JP-A-2002-175112

However, when conducting an on-the-spot inspection or the like in order to test for a failure in the detection processing unit of the transmitter integrated in a system, it is necessary to partially disable (disassemble) the transmitter in order to confirm behavior of the entire transmitter in the partially disabled state, and manpower and cost are undesirably incurred by such test.

More specifically, in order to temporarily change the values of the built-in display meter, the alarm, and other components in addition to changing the value of the 4–20 mA standard range output to abnormal values, it is necessary to actually disassemble the transmitter deliberately, thereby incurring manpower and money expenditure.

SUMMARY OF THE INVENTION

An object of the present invention is to solve the above-described problem and to provide a transmitter which can be easily tested for a failure in the detection processing unit thereof and thus reduce required manpower and cost, as well as a method for testing the transmitter.

The invention can be summarized as follows.

(1) A transmitter provided with a detection processing unit for measuring a process variable and processing an electric signal which is based on the process variable, comprising a test unit for generating an malfunctioning state of the detection processing unit for a test.

(2) A method for testing a transmitter provided with a detection processing unit for measuring a process variable and processing an electric signal which is based on the process variable, comprising: a step of executing a test using a communication terminal connected to the transmission line for transmitting an output from the detection processing unit; a step of testing for an malfunctioning state of the detection processing unit; and a step of terminating the test using the communication terminal.

BRIEF DESCRIPTION OF THE DRAWINGS

FIG. 7 is a diagram showing waveforms indicating timings when a microprocessor is malfunctioning in the embodiment of FIG. 6.

FIG. 8 is a diagram showing waveforms indicating timings when the test is conducted in the embodiment of FIG. 6.

DETAILED DESCRIPTION OF THE PREFERRED EMBODIMENTS

The embodiments of the present invention are characterized by having a test unit. Hereinafter, a case wherein the test unit generates a malfunctioning state corresponding to a failure in a detection processing unit part other than the microprocessor and a case wherein the test unit generates a malfunctioning state corresponding to a failure in the detection processing unit microprocessor will be described in this order.

Figure 1:
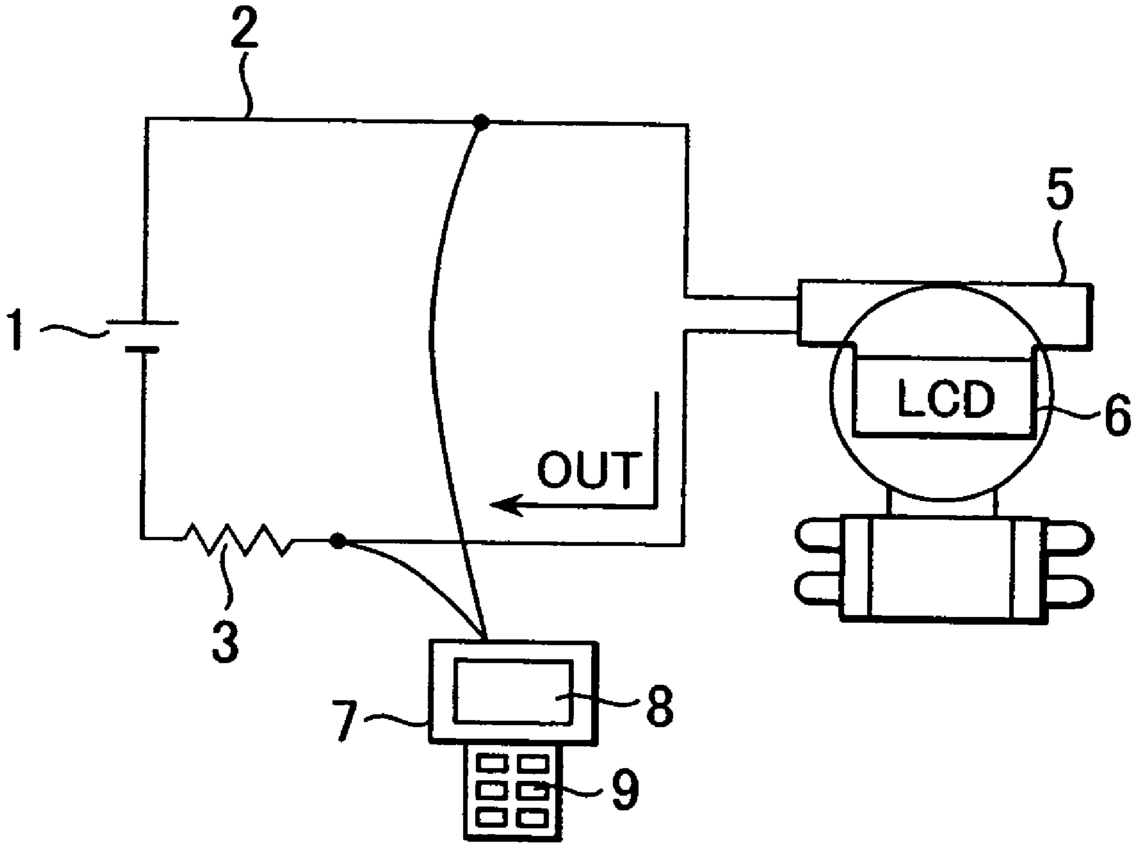
FIG. 1 Prior Art
FIG. 1 is a block diagram showing a conventional transmitter.
Figure 2:
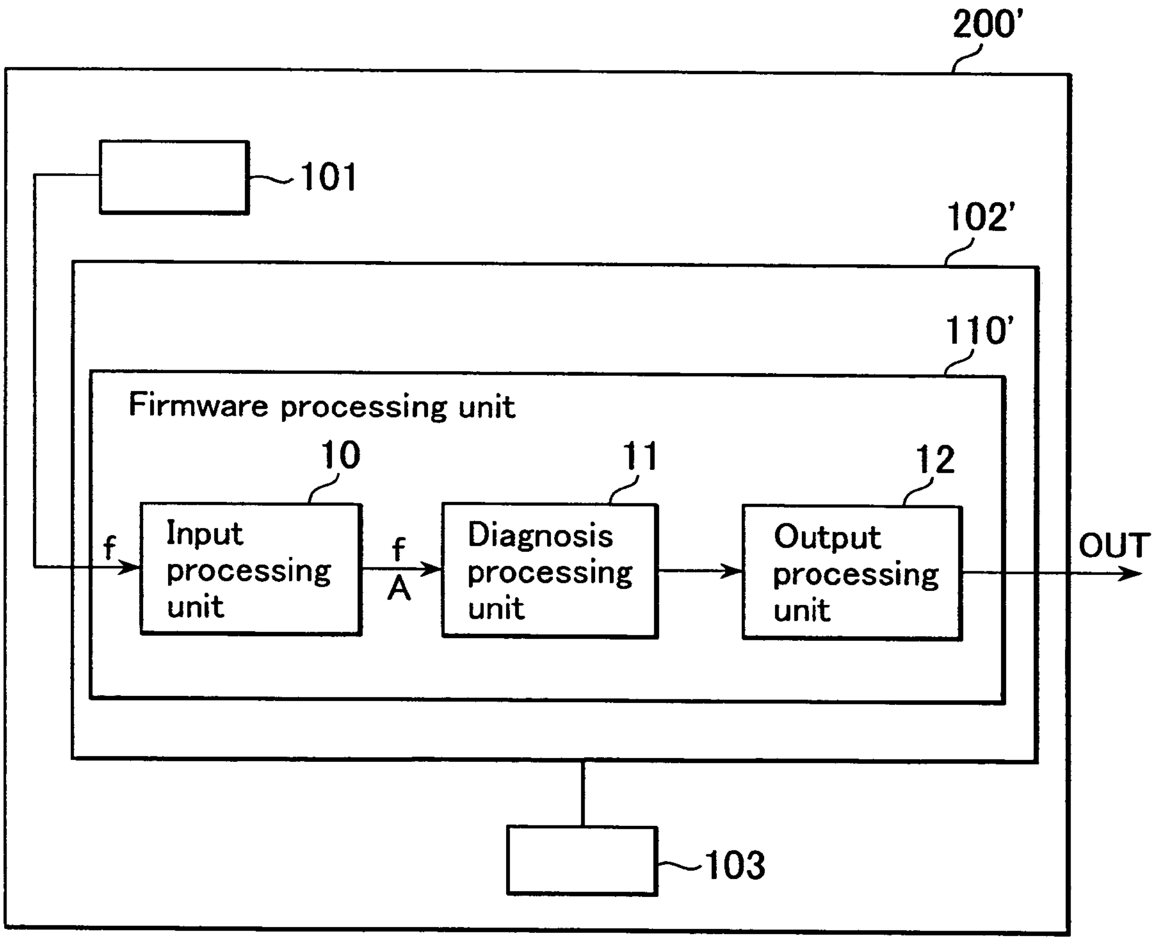
FIG. 2 Prior Art
FIG. 2 is a block diagram showing a detection processing unit 200' of the conventional transmitter.
Figure 3:
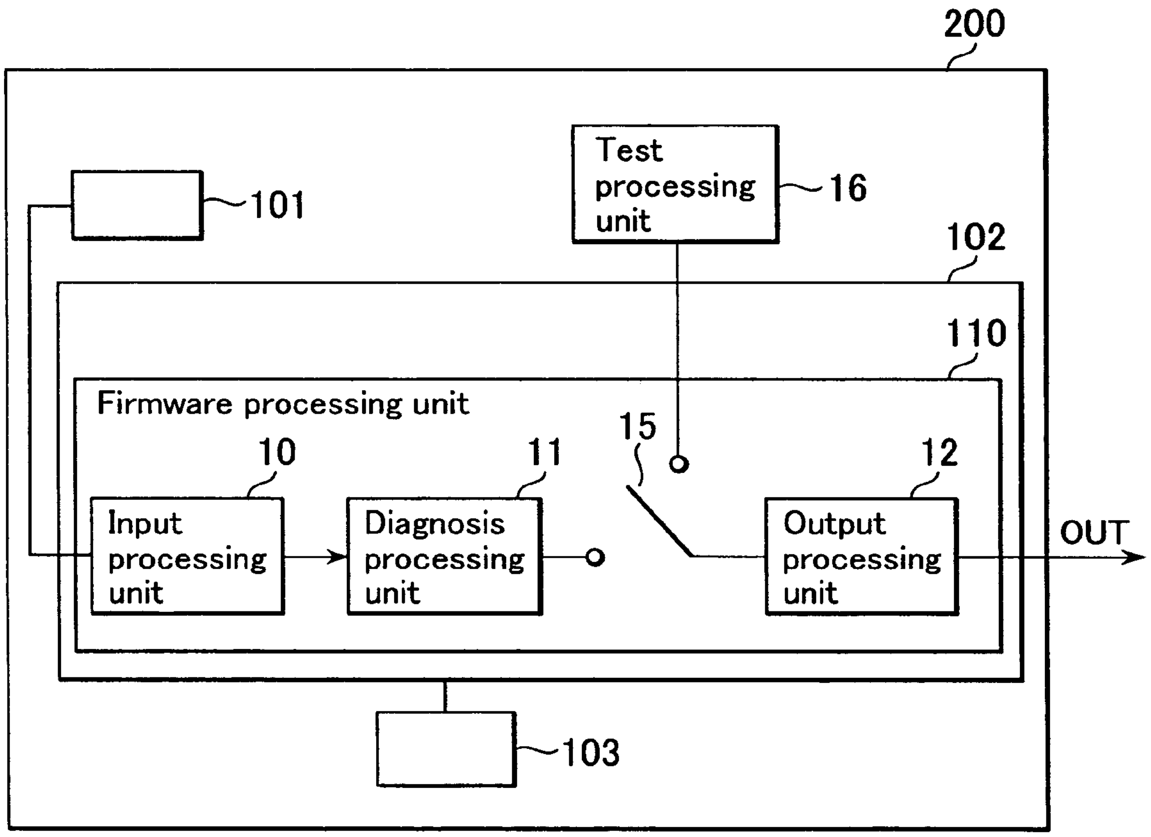
FIG. 3 is a block diagram showing a detection processing unit 200 of one embodiment of the present invention.

The present invention will be described in detail based on an embodiment of FIG. 3 in view of the case of the failure of the detection processing unit part other than the microprocessor 102. FIG. 3 is a block diagram showing the detection processing unit 200 of this embodiment. In the embodiment of FIG. 3, components equivalent to those of the conventional example of FIG. 2 are denoted by the same reference numerals to omit the descriptions therefor.

The embodiment of FIG. 3 is characterized by a constitution relating to a test processing unit 16 and a switching unit 15 of the test unit.

Referring to FIG. 3, the test processing unit 16 generates a detection processing unit failure state (malfunctioning state), specifically a parameter for an open circuit or short circuit, for a test.

A step to be performed by the switching unit 15 is inserted between steps to be performed by a diagnosis processing unit 11 and steps to be performed by the output processing unit 12. Accordingly, the switching unit 15 selects the diagnosis processing unit 11 in the case of a normal state and selects the test processing unit 16 in the case of conducting the test (malfunctioning state).

In the embodiment of FIG. 3, normal operation is similar to that of the conventional example of FIG. 2, and process variable information is transmitted. The test processing unit 16 is disconnected in the case of normal operation.

Hereinafter, conducting the test in the embodiment of FIG. 3 will be described. The input processing unit 10 and the diagnosis processing unit 11 are disconnected in the case of conducting the test. Information on failures in the detection processing unit is stored in memory 103 which stores values of the diagnosis processing unit.

Further, in the steps to be performed by the output processing unit 12, the output current is set removed from the 4–20 mA range in the high side or low side, since the memory 103 stores the information that there is a failure in the detection processing unit.

More specifically, the value of the 4–20 mA standard range output OUT is set to 110% of the maximum, 21.6 mA DC, or more, or set to 5% less than the minimum, 3.2 mA DC, or less.

The selection between the higher and the lower voltage is made by a hard switch (not shown) or a transmitted setting signal (not shown). A built-in display meter 6 displays an alarm. A display unit 8 of a communication terminal 7 also displays an alarm.

Thus, when conducting the test, the output processing unit 12 performs operation identical with that performed when there is a failure in a sensor 101. Also, in the embodiment of FIG. 3, the testing operation is based on the operation of the test processing unit 16 and is independent from the input processing unit 10 and the diagnosis processing unit 11.

Therefore, with the embodiment of FIG. 3, it is possible to easily conduct the test for failure in detection processing unit. Further, when conducting the test, it is possible to check operation of control valves (not shown) and the like of the components other than the transmitter 5. Furthermore, the normal operation returns immediately after terminating the test.

Since the test is conducted by using the firmware processing unit in the embodiment of FIG. 3, the test is simplified. Also, the firmware processing unit can be used to check for detection processing means failure not only for the 4–20 mA standard range output but also for any other value displayed in the built-in display meter 6 and the display unit 8.

Figure 4:
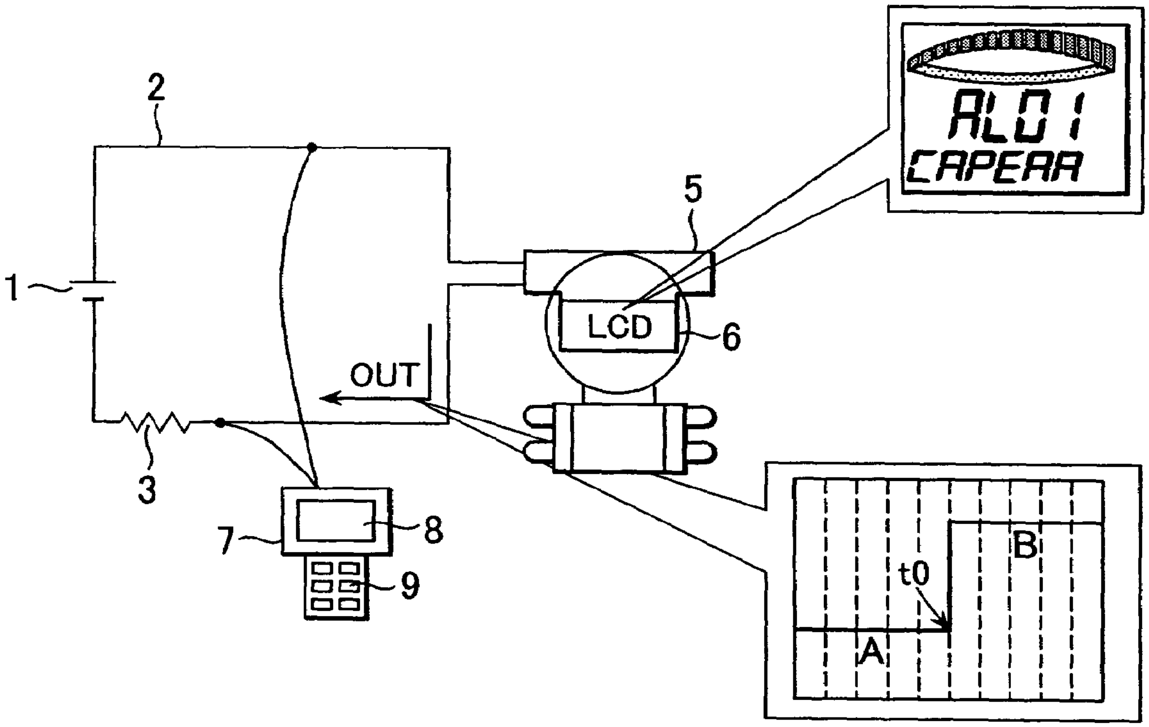
FIG. 4 is a block diagram of the state of a transmitter when a test is conducted.

FIG. 4 is a block diagram showing a state of the transmitter when the test is conducted. In FIG. 4, region A corresponds to the period of normal operation; time t0 corresponds to the start of the test; and region B corresponds to the period of testing. The output current is set beyond the 4–20 mA range, on the high side, and the built-in display meter 6 displays an alarm AL.01 in the region B.

Figure 5:
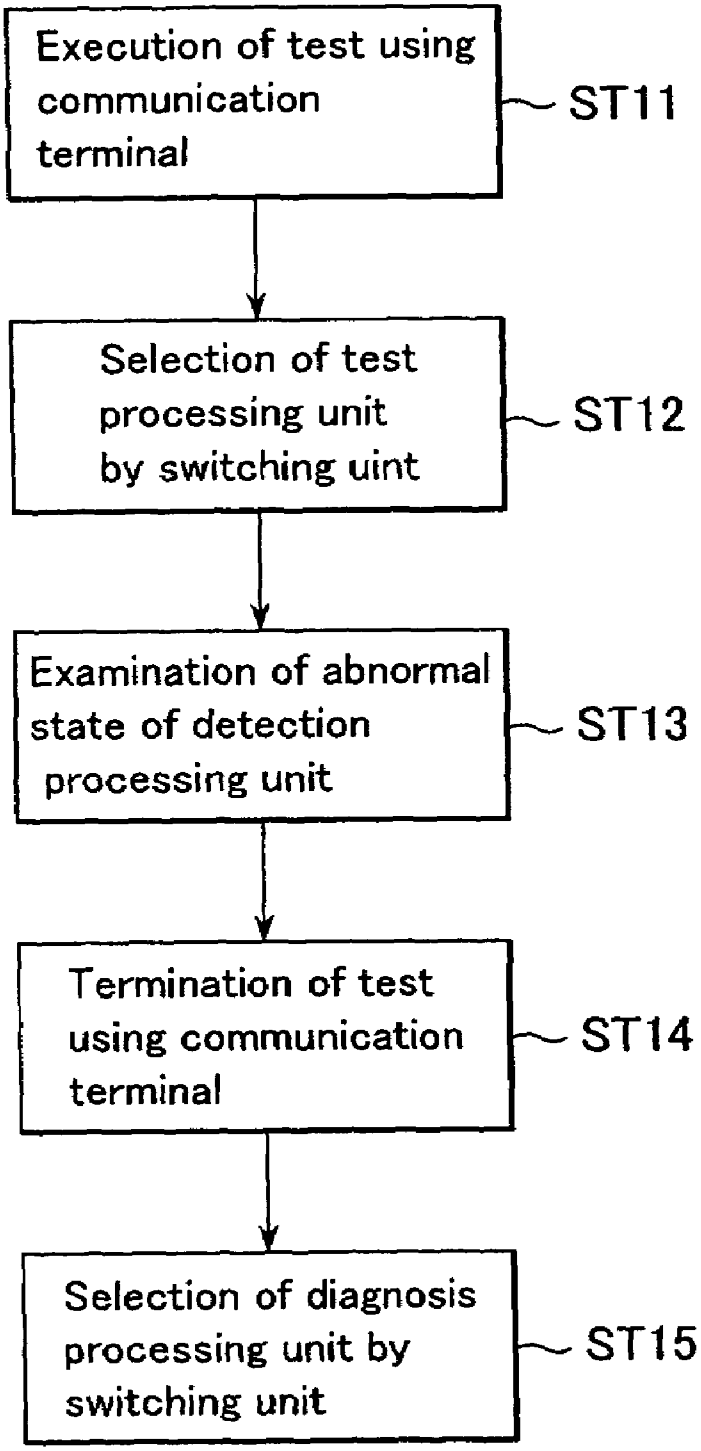
FIG. 5 is a flowchart of the embodiment of FIG. 3.

Hereinafter, a test suitable for the embodiment of FIG. 3 will be described with reference to FIG. 5. FIG. 5 is a flowchart of the embodiment of FIG. 3. The communication terminal 7 connected to the transmission line 2 for transmitting an output from the detection processing unit 200 is used in the test.

Firstly, the test is executed using the communication terminal 7 in Step ST11. More specifically, a signal for starting the test is sent from the communication terminal 7 to the transmitter 5.

Secondly, the switching unit 15 selects the test processing unit 16 based on the signal from the communication terminal 7 to generate a detection processing unit failure state (malfunctioning state) for test in Step ST12.

Thirdly, the malfunctioning state test of the detection unit is executed in Step ST13. Operations of the control valves (not shown) and the like connected to the transmitter 5 are confirmed, and then an operation test of the entire system including the transmitter is executed.

Fourthly, the test is terminated by using the communication terminal 7 in Step ST14. More specifically, the communication terminal 7 sends a signal for terminating the test to the transmitter 5.

Fifthly, in Step ST15 the switching unit 15 selects the diagnosis processing unit 11 depending on the signal for test termination from the communication terminal 7 to terminate the detection processing unit failure state for testing.

With the above-described test method, it is possible to easily conduct the test. Also, it is possible to easily confirm failsafe operation of the entire system including the transmitter. Further, it is possible to conveniently test the behavior of the entire system in the case where the transmitter is in the malfunctioning state. Furthermore, it is possible to easily execute an abnormal output examination in the case of an on-the-spot inspection at time of installation of the system.

Though the test processing unit 16 is used for generating the detection processing unit failure state for testing in the foregoing embodiment, it is possible to achieve substantially the same effect when the test processing unit 16 is used for generating an abnormal setting state of the transmitter 5. In this case, it is possible to conveniently confirm the abnormal setting state during an on-the-spot inspection when installing the system in a customer's premises, for example.

Alternatively, it is possible to achieve substantially the same effect when the test processing unit 16 is used for generating a malfunctioning processing state of the transmitter 5. In this case, it is possible to conveniently confirm the malfunctioning processing state during an on-the-spot inspection when installing the system in a customer's premises, for example.

Figure 6:
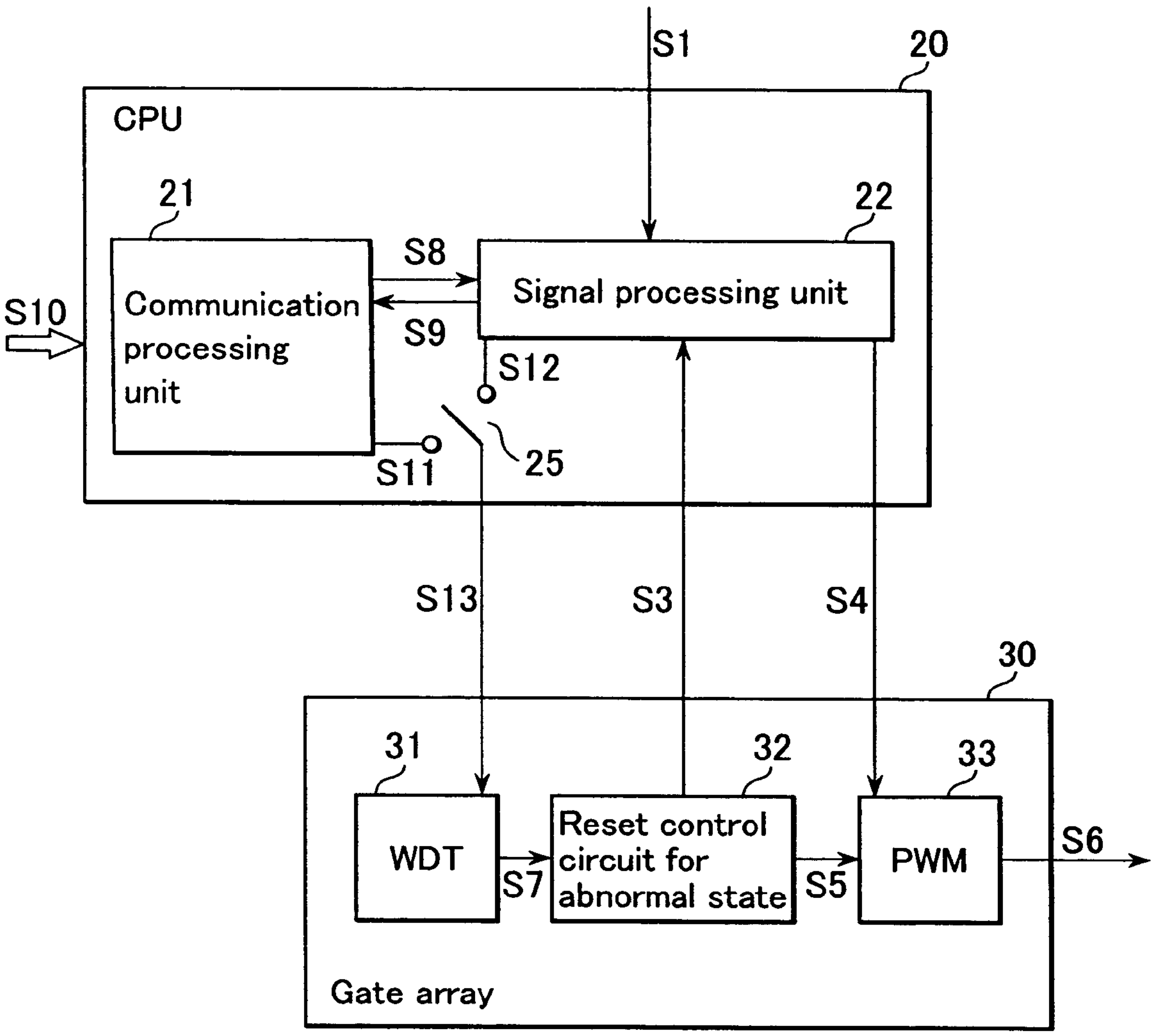
FIG. 6 is a block diagram showing a signal processing circuit in another embodiment of the invention.

Hereinafter, this invention will be described in detail based on another embodiment shown in FIG. 6 dealing with a case equivalent to failure in the detection processing unit of the microprocessor 20. FIG. 6 is a block diagram showing a signal processing circuit of this embodiment.

The embodiment of FIG. 6 is characterized by the constitution of its test unit with regard to the microprocessor 20 and gate array 30.

Referring to FIG. 6, the microprocessor (CPU) 20 is provided with a communication processing unit 21 and a processing unit 22. The gate array 30 is provided with a watchdog timer (WDT) 31, the reset control circuit for abnormality 32, and a pulse width modulation circuit (PWM) 33. The microprocessor 20 and the gate array 30 are independent hardware. For example, an internal portion of the microprocessor 20 is formed from firmware, and the gate array 30 is formed from an ASIC.

A signal S1 is input from a sensor (not shown) to the signal processing unit 22. A signal S8 is transferred from the communication processing unit 21 to the signal processing unit 22. A signal S9 is transferred from the signal processing unit 22 to the communication processing unit 21.

The communication processing unit 21 inputs a test input S10 to generate a signal S11. The signal processing unit 22 generates a signal S12. A switching unit 25 selects either the signal S11 or S12 to use as the diagnosis signal S13.

The diagnosis signal S13 is transferred from the switching unit 25 to the watchdog timer 31. A reset signal S3 is transferred from the reset control circuit for abnormality 32 to the signal processing unit 22. A signal S4 is transferred from the signal processing unit 22 to the pulse width modulation circuit 33.

A judgment signal S7 is transferred from the watchdog timer 31 to the reset control circuit for abnormality 32. A failure signal S5 is transferred from the reset control circuit for abnormality 32 to the pulse width modulation circuit 33. A 4–20 mA standard range output S6 is output from the pulse width modulation circuit 33 to the transmission line 2.

Hereinafter, operation to be performed when the embodiment of FIG. 6 is in a normal state will be described. The test input S10 is disabled, and the switching unit 25 selects the signal S12. The signal S12 becomes the diagnosis signal S13 (S12=S13).

The signal processing unit 22 of the microprocessor 20 generates the signal S4, and the pulse width modulation circuit 33 generates the 4–20 mA standard range output S6. Thus, a process variable is detected by the sensor and then converted into the electric signal, and this electric signal is processed by the microprocessor 20 to be output to the transmission line 2 (not shown).

The signal processing unit 22 generates a periodic signal S12 at a predetermined timing, and then the signal S12 becomes the diagnosis signal S13, so that the watchdog timer 31 is reset by the diagnosis signal S13. Hence, the judgment signal S7, the reset signal S3, and the failure signal S5 are disabled.

The communication processing unit 21 communicates with a communication terminal 7 and the like (not shown) connected to the transmission line 2 (not shown) via the signal processing unit 22 and the pulse width modulation circuit 33.

Hereinafter, operation to be performed when in the embodiment of FIG. 6 the detection processing unit constituting the microprocessor 20 is in a malfunctioning state will be described. In this case, the test input S10 is disabled, and the switching unit 25 selects the signal S12. The signal S12 becomes the diagnosis signal S13 (S12=S13).

The signal S12 and the diagnosis signal S13 are disabled; the watchdog timer 31 is saturated; and the judgment signal S7 and the rest signal S3 are enabled. The normal state of the microprocessor 20 can be recovered by the reset signal S3 in some cases.

When predetermined time has elapsed after the judgment signal s7 is enabled, the failure signal S5 is enabled, and the pulse width modulation circuit 33 causes the 4–20 mA standard range output current S6 to be beyond the 4–20 mA range on the high or low side. The selection between a high value and a low value is decided by a hard switch (not shown) or a set communication (not shown).

When the value of the 4–20 mA standard range output S6 is set beyond the 4–20 mA range on the high or low side, the clock pulse to the microprocessor 20 is stopped to halt the microprocessor 20 and to cause the built-in display meter 6 to light the "malfunctioning" message (not shown). At this time point, the communication between the communication processing unit 21 and the communication terminal 7 and the like is stopped, also.

Hereinafter, operation to be performed when the test is conducted in the embodiment of FIG. 6 will be described. The test input S10 is enabled; the signal S11 is disabled; and the switching unit 25 selects the signal S11. The Signal S11 becomes equal to the diagnosis signal S13 (S11=S13).

Thus, the diagnosis signal S13 is disabled; the watchdog timer 31 is saturated; and the judgment signal S7 is enabled.

Hence, the operation to be performed when conducting the test is the same as that performed when the detection processing unit constituting the microprocessor 20 is in the malfunctioning state.

Thus, with the embodiment of FIG. 6, it is possible to conveniently conduct the test for the malfunction in the detection processing unit constituting the microprocessor 20. Note that the gate array 30 is in the normal state when the microprocessor 20 is in the malfunctioning state. However, the malfunction in the detection processing unit constituting the gate array 30 is detected by the microprocessor 20 (explanation of this point is omitted in this specification).

Hereinafter, a test method suitable for the embodiment of FIG. 6 will be described.

Firstly, Step ST21, where communication terminal 7 performs a test, is executed. More specifically, the communication terminal 7 sends a signal for starting the test to the transmitter 5, and then the process goes to Step ST22.

Secondly, Step ST22 is executed, wherein the switching unit 25 selects the signal S11 based on the signal sent from the communication terminal 7 to disable the diagnosis signal S13, and then the process goes to Step ST23.

Thirdly, Step ST23 is executed, wherein the gate array 30 generates the reset signal S3, and then the process goes to Step ST24.

Fourthly, Step ST24 is executed, wherein the gate array 30 detects a failure in the microprocessor 20 based on the diagnosis signal S13 (judgment signal S14) and enables a failure signal S5, and stops the microprocessor, and then the process goes to Step ST25.

Fifthly, Step ST25 is executed, wherein operations of the control valves (not shown) and the like connected to the transmitter 5 are confirmed, and a behavior test for the entire system including the transmitter 5 is executed, and then the process goes to Step ST26.

Sixthly, Step ST26 is executed, wherein the communication terminal 7 terminates the test. More specifically, the communication terminal 7 sends a test termination signal to the transmitter, and then the process goes to Step ST27.

Seventhly, Step ST27 is executed, wherein the switching unit 25 selects the signal S12 based on the test termination signal sent from the communication terminal 7 to make the periodic signal S12 generated by the microprocessor 20 the diagnosis signal S13.

With the above-described test method, it is possible to conduct the test as easily as in the embodiment of FIG. 3.

Hereinafter, operation of the embodiment of FIG. 6 will be described in detail with reference to FIG. 7. FIG. 7 is a diagram showing waveforms indicating timings when the microprocessor 20 is malfunctioning in the embodiment of FIG. 6.

Shown in FIG. 7A is the configuration of the diagnosis signal S13 (WDTCL) sent to the watchdog timer (WDT) 31; shown in FIG. 7B is a waveform of the 4–20 mA standard range output S6; shown in FIG. 7C is an operation state of the microprocessor (CPU) 20; and shown in FIG. 7D are the flag states of an EEPROM (not shown) serving as the nonvolatile memory for storing the information on failure (malfunctioning state) of the microprocessor 20.

Region C of FIG. 7 is a non-active state. A region r1 and a region r2 of FIG. 7 are each states in which the microprocessor 20 is reset, and this corresponds to the state in the embodiment of FIG. 6 in which the reset signal S3 is enabled. Region r0 of FIG. 7 is a state in which the transmitter 5 is reset (restarted). Region D of FIG. 7 is a state in which the 4–20 mA standard range output S6 is higher than the 4–20 mA range, and Region E of FIG. 7 is a state of stoppage. Region F of FIG. 7 is a state in which the flag is in an on-state.

Referring to FIG. 7, the transmitter 5 is in the normal state before the time t1. The watchdog timer 31 is reset periodically at a predetermined timing during this period. Also, the 4–20 mA standard range output S6 takes a normal value; microprocessor 20 is in the normal state; and the flag is in an off-state.

More specifically, the diagnosis signal S13 (WDTCL) is periodically sent to the watchdog timer 31 at the predetermined timing; the 4–20 mA standard range output S6 takes a normal value; the microprocessor is in the normal state; and the flag is in the off-state.

When a failure occurs in the microprocessor 20 at the time t1, the flag is brought into the on-state.

More specifically, when the failure occurs in the microprocessor 20 at the time t1, the transmission of the signal S13 (WDTCL) to the watchdog timer 31 is stopped, so that the watchdog timer 31 detects the malfunction in the microprocessor (CPU) 20 and brings the flag into the on-state.

Then, the microprocessor 20 is reset (r1) a second after the time t1, and the microprocessor 20 is reset again (r2) two seconds after the first reset. With the second reset, the 4–20 mA standard range output S6 is lowered. The microprocessor 20 is not restored to operation since it is malfunctioning.

Further, the 4–20 mA standard range output S6 is set above the 4–20 mA range two seconds after the second reset, and the microprocessor 20 stops. That is, after the two reset operations, the 4–20 mA standard range output S6 is set above the 4–20 mA range and the microprocessor 20 stops.

More specifically, when two seconds have passed after the second reset, the watchdog timer 31 detects the failure in the microprocessor 20; the signals S7, S5, and S3 are generated; the 4–20 mA standard range output S6 is set above the 4–20 mA range in response to the signal S5; and the microprocessor 20 is stopped in response to the signal S3. That is, after the two reset operations, the 4–20 mA standard range output S6 is set above the 4–20 mA range and the microprocessor 20 stops.

After elimination of the failure in the microprocessor 20 and a release of the reset (r0) by the transmitter 5, the transmitter 5 returns to the normal state; the watchdog timer 31 is reset periodically at the predetermined timing; the 4–20 mA standard range output S6 takes a normal value; the microprocessor 20 returns to the normal state; and the flag is brought into the off-state.

More specifically, after elimination of the failure in the microprocessor 20 and a release of the reset (r0), the transmitter 5 returns to the normal state; the diagnosis signal S13 (WDTCL) is sent periodically to the watchdog timer 31 at the predetermined timing; the 4–20 mA standard range output S6 takes a normal value; the microprocessor returns to the normal state; and the flag is brought into the off-state.

Hereinafter, the operation of the embodiment of FIG. 6 will be described in detail with reference to FIG. 8. FIG. 8 is a diagram showing timings of waveforms when conducting the test in the embodiment of FIG. 6. In FIG. 8, elements identical with those shown in FIG. 7 are denoted by the same reference numerals to omit the descriptions therefor.

Shown in FIG. 8A is a waveform showing the 4–20 mA standard range output S6; shown in FIG. 8B is a value of a RAM (RAM count) of the microprocessor 20; shown in FIG. 8C is a value of the EEPROM of the microprocessor 20 (EEPROM count); and shown in FIG. 8D is a state of the diagnosis signal S13 (WDTCL) sent to the watchdog timer 31.

When starting up the microprocessor 20, operation of increment (++1) is performed when the RAM count is 1 or 2, and reset operation is performed when the RAM count is 3 in starting up the microprocessor 20. When the test is conducted, the RAM count is set to 1.

The diagnosis signal WDTCL is disabled when the RAM count is other than 0.

Referring to FIG. 8, the transmitter 5 is in the normal state before the time t1. The 4–20 mA standard range output S6 takes the normal value; the RAM count becomes 0; the EEPROM count becomes 0; and the diagnosis signal WDTCL is normal.

When the test is started at the time t1, the RAM count becomes 1; the diagnosis signal WDTCL is disabled; and the EEPROM count becomes 1 by downloading the value of the RAM count.

At the time t11, the microprocessor 20 is reset (r1), and the RAM count becomes 1 by uploading the EEPROM count value.

Then, the RAM count is incremented to become 2, and the EEPROM count becomes 2 by downloading the RAM count value. At the time t12, the reset of the microprocessor 20 is released.

At the time t13, the microprocessor 20 is reset (r2), and the RAM count becomes 2 by uploading the EEPROM count value.

Then, the RAM count is incremented to become 3, and the EEPROM count becomes 3 by downloading the RAM count value. At the time t14, the reset of the microprocessor 20 is released.

At the time t15, the 4–20 mA standard range output S6 is set above the 4–20 mA range to stop the microprocessor 20. The EEPROM count remains at 3.

At the time t16, the test is terminated, and the transmitter 5 is reset (r0). The RAM count becomes 3 by uploading the EEPROM count value. Then, the RAM count is reset to 0.

At the time t2, the transmitter 5 releases the reset. After that, the transmitter 5 is in the normal state; the 4–20 mA standard range output S6 takes a normal value; and the diagnosis signal WDTCL is in the normal state. The EEPROM count becomes 0 by downloading the RAM count value. Thus, after the 4–20 mA standard range output S6 is set above the 4–20 mA range, the transmitter 5 is restored to operation when the transmitter 5 is restarted (reset).

The EEPROM stores the test state in a nonvolatile manner and counts the resets in the region r1 and the resets in the region r2 (reset signal S3) based on the information stored in the EEPROM. Therefore, the embodiment based on the operation of FIG. 8 operates stably.

Though the test for checking the malfunction in the detection processing unit constituting the microprocessor 20 is described in the foregoing embodiment, it is possible to modify the embodiment for conducting the test for other detection processing units such as the gate array 30 and the sensor (not shown). In the modification, a test function is installed in the detection processing unit. The modification example has substantially the same constitution and achieves a similar effect.

Though the communication terminal 7 controls the switching unit in the foregoing embodiments, it is possible to achieve the same effect by controlling the switching unit from upstream of the transmitter 5.

Also, though the communication terminal 7 controls the switching unit in the foregoing embodiments, it is possible to achieve the same effect by controlling the switching unit by the communication signals of an upstream system which is connected to the distributor 1 and controls the transmitter 5.

The foregoing embodiments can be applied to a differential pressure meter, a temperature meter, and a flow rate meter, for example.

Though the two wire process control transmitter is described in the foregoing embodiments, it is possible to achieve the same effect by using a transmitter other than the two wire process control transmitter so far as the transmitter has a similar constitution.

As described above, the present invention is not limited to the foregoing embodiments and encompasses many alterations and modifications so far as the alterations and the modifications do not depart from the spirit of the invention.

As is apparent from the foregoing, this invention has the following effects.

According to this invention, it is possible to easily conduct a test for a failure in the detection processing unit of a transmitter without dismantling the transmitter, and to provide a transmitter as well as a method for testing the transmitter that requires less manpower and cost.

According to this invention, it is possible to easily test behavior of the entire system when the transmitter is in a malfunctioning state. Further, it is possible to easily check failsafe mechanisms of the entire system which operate when the transmitter is in the malfunctioning state.

According to this invention, it is possible to conduct a test for checking only the transmitter during an on-the-site inspection. Also, it is possible to conveniently execute an abnormal output examination during the on-the-site inspection.

According to this invention, it is possible for a user operating the transmitter to easily perform the test for failure in the detection processing unit. Normal operation can be resumed immediately after the completion of the test.

What is claimed is:

1. A transmitter provided with a detection processing unit for detecting a process variable and processing an electric signal which is based on the process variable, comprising:
- a test unit for generating a malfunctioning state of the detection processing unit for a test;
- a microprocessor for conducting the signal processing and generating a diagnosis signal; and
- a gate array for detecting a failure in the microprocessor based on the diagnosis signal.

2. The transmitter according to claim 1, wherein the test unit comprises a switching unit which is included in a firmware processing unit, the switching unit switching between a normal state and the malfunctioning state.

3. The transmitter according to claim 2, wherein the switching unit is controlled by a communication terminal connected to a transmission line for transmitting an output from the detection processing unit.

4. The transmitter according to claim 3, wherein the switching unit comprises a storage unit in which is stored malfunctions in sensors for detecting the process variable, and in which is written information on the malfunctioning state.

5. The transmitter according to claim 4, wherein the test unit generates a failure state of the detection processing unit, contains a built-in display meter which indicates the malfunctioning state, and is of a two wire type.

6. The transmitter according to claim 2, wherein the switching unit comprises a storage unit in which is stored malfunctions in a sensor for detecting the process variable, and in which is written information on the malfunctioning state.

7. The transmitter according to claim 6, wherein the test unit generates a failure state of the detection processing unit, comprises an built-in display meter that indicates the malfunctioning state, and is of a two wire type.

8. The transmitter according to claim 1, wherein the gate array generates a reset signal for the microprocessor depending on the diagnosis signal, and the microprocessor comprises a nonvolatile storage unit which counts the reset signals.

* * * * *